(12) United States Patent
Hargreaves et al.

(10) Patent No.: US 10,775,463 B2
(45) Date of Patent: Sep. 15, 2020

(54) METHOD FOR ESTIMATING T2

(71) Applicant: The Board of Trustees of the Leland Stanford Junior University, Palo Alto, CA (US)

(72) Inventors: Brian A. Hargreaves, Menlo Park, CA (US); Bragi Sveinsson, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 709 days.

(21) Appl. No.: 15/482,351

(22) Filed: Apr. 7, 2017

(65) Prior Publication Data
US 2017/0299679 A1    Oct. 19, 2017

Related U.S. Application Data

(60) Provisional application No. 62/324,328, filed on Apr. 18, 2016.

(51) Int. Cl.
*G01R 33/50* (2006.01)
*G01R 33/483* (2006.01)
*G01R 33/48* (2006.01)

(52) U.S. Cl.
CPC ......... *G01R 33/50* (2013.01); *G01R 33/4816* (2013.01); *G01R 33/4835* (2013.01)

(58) Field of Classification Search
CPC ............ G01R 33/4816; G01R 33/4818; G01R 33/482; G01R 33/4822; G01R 33/4824; G01R 33/4826; G01R 33/4828; G01R 33/483; G01R 33/4831; G01R 33/4833;
(Continued)

(56) References Cited

U.S. PATENT DOCUMENTS 4,746,865 A * 5/1988 Kasugai ................ G01R 33/56
324/307
8,508,225 B2   8/2013 Granlund et al.
(Continued)

OTHER PUBLICATIONS

Sviensson, Bragi "A Simple Analytic Method for Estimating T2 in the Knee from DESS" Magnetic Resonance Imaging, vol. 38 p. 63-70, Dec. 22, 2016.

*Primary Examiner* — Tung X Nguyen
*Assistant Examiner* — Robert P Alejnikov, Jr.
(74) *Attorney, Agent, or Firm* — Beyer Law Group LLP

(57) ABSTRACT

A method for providing an estimated 3D $T_2$ map for magnetic resonance imaging using a Double-Echo Steady-State (DESS) sequence for a volume of an object in a magnetic resonance imaging (MRI) system is provided. A DESS scan of the volume is provided by the MRI system. Signals $S_1$ and $S_2$ are acquired by the MRI system. Signals $S_1$ and $S_2$ are used to provide a $T_2$ map for a plurality of slices of the volume, comprising determining repetition time (TR), echo time (TE), flip angle α, and an estimate of the longitudinal relaxation time ($T_1$), and wherein the DESS scan has a spoiler gradient with an amplitude G and a duration τ and ignoring echo pathways having spent more than two repetition times in the transverse plane.

4 Claims, 8 Drawing Sheets
(5 of 8 Drawing Sheet(s) Filed in Color)

(58) Field of Classification Search
CPC ............ G01R 33/4835; G01R 33/4836; G01R 33/4838; G01R 33/5602; G01R 33/5617
USPC ........................................................ 324/309
See application file for complete search history.

(56) References Cited

U.S. PATENT DOCUMENTS

| 8,706,188 | B2* | 4/2014 | Koo ........................ A61B 5/055 |
| | | | 382/128 |
| 9,915,750 | B2* | 3/2018 | Hurlimann ................ G01V 3/32 |
| 2012/0112743 | A1* | 5/2012 | Granlund ........... G01R 33/5614 |
| | | | 324/309 |

* cited by examiner

US 10,775,463 B2

METHOD FOR ESTIMATING T2

CROSS REFERENCE TO RELATED APPLICATIONS

This application claims priority under 35 U.S.C. § 119(e) from U.S. Provisional Application No. 62/324,328, entitled "SIMPLE ESTIMATION OF T2 MAPS USING THE DOUBLE-ECHO STEADY-STATE SEQUENCE", filed Apr. 18, 2016.

GOVERNMENT RIGHTS

This invention was made with Government support under contracts AR063643 and EB002524 and P41EB015891 awarded by the National Institutes of Health. The Government has certain rights in the invention.

BACKGROUND OF THE INVENTION

This invention relates generally to magnetic resonance imaging (MRI). Magnetic resonance imaging (MRI) is a non-destructive method for the analysis of materials and is an approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During MRI, each nuclear spin responds to four different effects: precession about the main magnetic field, nutation about an axis perpendicular to the main field, and both transverse and longitudinal relaxation.

SUMMARY OF THE INVENTION

In accordance with the invention, a method for providing an estimated 3D $T_2$ map for magnetic resonance imaging using a Double-Echo Steady-State (DESS) sequence for a volume of an object in a magnetic resonance imaging (MRI) system is provided. A DESS scan of the volume is provided by the MRI system. Signals $S_1$ and $S_2$ are acquired by the MRI system. Signals $S_1$ and $S_2$ are used to provide a $T_2$ map for a plurality of slices of the volume, comprising determining repetition time (TR), echo time (TE), flip angle $\alpha$, and an estimate of the longitudinal relaxation time ($T_1$), and wherein the DESS scan has a spoiler gradient with an amplitude G and a duration $\tau$ and ignoring echo pathways having spent more than two repetition times in the transverse plane.

In another manifestation, a method for providing an estimated 3D $T_2$ map for magnetic resonance imaging using a Double-Echo Steady-State (DESS) sequence for a volume of an object in a magnetic resonance imaging (MRI) system is provided. A DESS scan of the volume is provided by the MRI system. Signals $S_1$ and $S_2$ are acquired by the MRI system. $S_1$ and $S_2$ are used to provide a $T_2$ map for a plurality of slices of the volume, using the equation $$T_2 = \frac{-2(TR - TE)}{\log\left[\left(\frac{S_2}{S_1 \sin^2 \frac{\alpha}{2}}\right) f(\alpha, TR, T1)\right]},$$

wherein $f(\alpha, TR, T1)$ is a function that is not proportional to $$\sin^2 \frac{\alpha}{2}$$

and TR is a repetition time, TE is an echo time, and $\alpha$ is a flip angle.

The invention and objects and features thereof will be more readily apparent from the following detailed description and appended claims when taken with the drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF ILLUSTRATED EMBODIMENTS

1. Introduction

Figure 1:
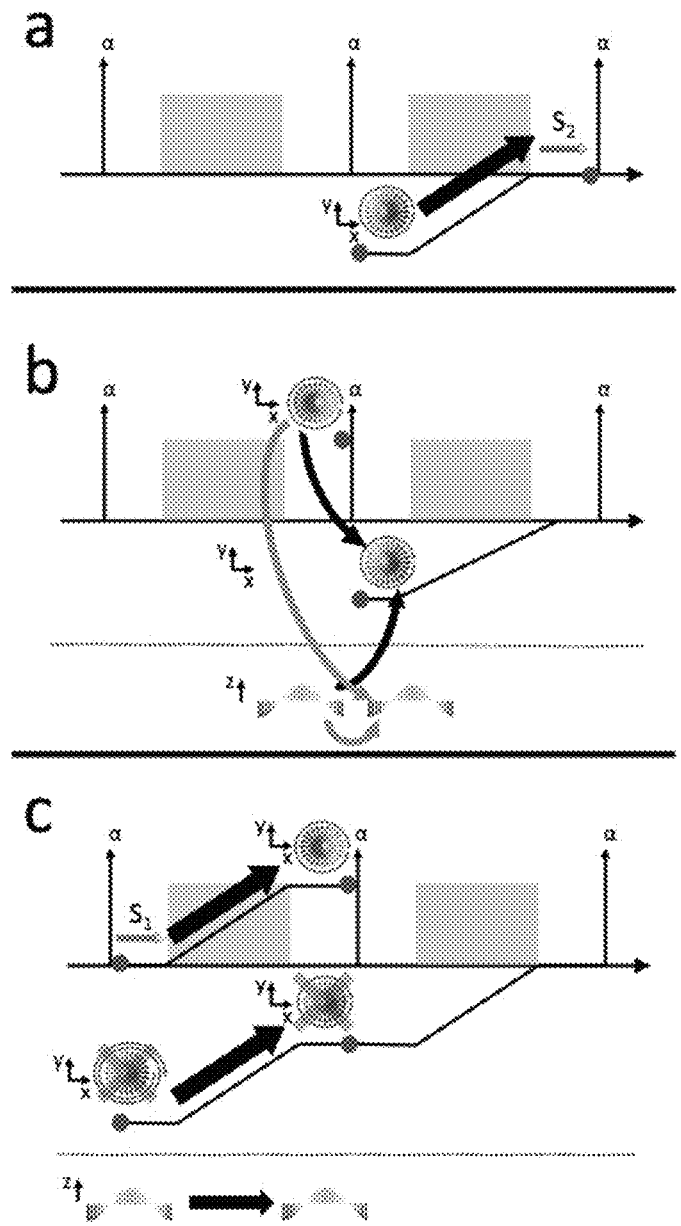
FIG. 1 is a series of graphic displays of an embodiment.

The Double-Echo Steady-State (DESS) sequence offers distortion-free, SNR-efficient 3D-imaging with good contrast flexibility. DESS is a gradient-spoiled steady-state sequence, collecting two echoes per repetition (TR), with the spoiler gradient separating the two echoes. The two signals, often labeled $S_1$ (before the spoiler) and $S_2$ (after the spoiler), have different contrast. The $S_1$ signal is often said to have $T_1/T_2$ weighting and $S_2$ to have a mixture of $T_2$ and diffusion weighting, but in reality both the contrasts are quite complicated functions of the extrinsic scan parameters (TR, TE, flip angle $\alpha$, gradient amplitude G and gradient duration $\tau$) as well as the intrinsic tissue parameters ($T_1$, $T_2$, and diffusivity). While DESS has been used for various anatomies, such as the breast and the prostate, it has found particularly widespread use for musculoskeletal imaging, where, for example, it has been used in the Osteoarthritis Initiative (OAI) to determine Osteoarthritis (OA) progression.

To improve OA detection, DESS has been used for quantitative imaging of $T_2$ and apparent diffusion coefficient (ADC). These have been found to correlate with collagen network organization and proteoglycan concentration, respectively. A number of signal models have been developed to quantitatively describe both of the DESS signals and their dependency on tissue parameters. These include both closed-form and non-closed-form analytical methods as well as numerical methods.

Some methods model the DESS signals completely and can be considered fully accurate for a single $T_1$, $T_2$, and diffusivity in a voxel. However, owing to their complexity, using these models for parameter estimation typically requires solving them with a numerical search over a predetermined solution set. This inhibits immediate, automatic creation of parameter maps right at the scanner, which would be of great value for clinical scans. Furthermore, a method in Freed D E, Scheven U M, Zielinski L J, Sen P N, Hürlimann M D. Steady-state free precession experiments and exact treatment of diffusion in a uniform gradient. Journal of Chemical Physics. 2001; 115(9):4249-4258, which is incorporated by reference for all purposes, and which describes the magnetization with a continued fraction, does not allow for pulsed gradients. For these reasons, approximate models are often used to estimate the desired parameter in spite of known errors. For example, in Welsch G H, Scheffler K, Mamisch T C, Hughes T, Millington S, Deimling M, Trattnig S. Rapid Estimation of Cartilage $T_2$ Based on Double Echo at Steady State (DESS) With 3 Tesla. Magnetic Resonance in Medicine. 2009; 62:544-549, which is incorporated by reference for all purposes, the following model, originally suggested in Bruder H, Fischer H, Graumann R, Deimling M. A New Steady-State Imaging Sequence for Simultaneous Acquisition of Two MR Images with Clearly Different Contrasts. Magnetic Resonance in Medicine. 1988; 7:35-42, which is incorporated by reference for all purposes, was used to estimate $T_2$ from a single DESS scan:

$$\frac{S_2}{S_1} = e^{-\frac{2(TR-TE)}{T2}} \quad (1)$$

This relationship essentially describes a spin echo relationship between $S_2$ and $S_1$ in consecutive TRs. Although this approach may offer useful results in spite of errors in $T_2$, practical $T_2$ mapping would benefit from a comparably simple analytical formula that is even more accurate.

An embodiment of the invention provides a model that can be used for $T_2$ estimation from a single DESS scan. Our analysis demonstrates that higher-order echo pathways can often be ignored, based on pathway cancellation effects and signal decay, leading to a simple and accurate linear relationship between the signals from two DESS echoes. We validate the overall approach using simulations, phantom scans, and in vivo knee scans.

2. Theory 2.1 Derivation of Simplified Signal Ratio

A simple yet accurate linear approximation of the relationship between the two DESS echoes can be derived by tracing the components that contribute to the magnetization, starting at $S_2$, until we arrive at $S_1$. We use the Extended Phase Graph (EPG) formalism, which decomposes magnetization into a basis of positively and negatively dephased transverse states (coefficients $F_0$, $F_1$, $F_2$, ... ) as well as sinusoidally varying longitudinal states (coefficients $Z_0$, $Z_1$, $Z_2$, ... ). The procedure is explained graphically in FIGS. 1a-c, using similar graphical structures as those introduced by Scheffler K. A Pictorial Description of Steady-States in Rapid Magnetic Resonance Imaging. Concepts in Magnetic Resonance. 1999; 11(5):291-304, which is incorporated by reference for all purposes. In the EPG formalism, the magnetization can be represented by a matrix of coefficients ($F_n$ and $Z_n$) that multiply transverse states with n cycles of positive or negative dephasing, and longitudinal states with n cycles of sinusoidal variation:

$$M = \begin{bmatrix} F_0 & F_1 & F_2 & \ldots \\ F_0^* & F_{-1}^* & F_{-2}^* & \ldots \\ Z_0 & Z_1 & Z_2 & \ldots \end{bmatrix} \quad (2)$$

where an asterisk (*) denotes a complex conjugate. The observable signal is the DC transverse term $F_0$. Relaxation and diffusion over time are represented by scaling of the elements ($T_1$ relaxation is represented by an additive factor to the DC longitudinal term, $Z_0$) and the effect of a gradient is represented by shifting the transverse coefficients $F_n$.

The effects of $T_1/T_2$ decay, as well as diffusion, on state n, can be described by the scaling terms $$\tilde{E}_{2,n} = e^{-\frac{TR}{T2} - [(n^2+n+\frac{1}{2})TR - \frac{\tau}{6}]\Delta k^2 D} \text{ and } \tilde{E}_{1,n} = e^{-\frac{TR}{T1} - n^2 TR \Delta k^2 D}$$

(assuming the gradient in the center of the TR). The effect of an RF pulse with flip angle $\alpha$ and phase $\phi$ is represented by matrix multiplication with the matrix:

$$R(\alpha, \phi) = \begin{bmatrix} \cos^2\frac{\alpha}{2} & e^{2i\phi}\sin^2\frac{\alpha}{2} & -ie^{i\phi}\sin\alpha \\ e^{-2i\phi}\sin^2\frac{\alpha}{2} & \cos^2\frac{\alpha}{2} & ie^{-i\phi}\sin\alpha \\ -\frac{i}{2}e^{-i\phi}\sin\alpha & \frac{i}{2}e^{i\phi}\sin\alpha & \cos\alpha \end{bmatrix} \quad (3)$$

Here, TR and TE represent the repetition and echo time, respectively, $\alpha$ is the flip angle, D is the diffusivity, and the dephasing per unit length induced by the unbalanced gradient is denoted by $\Delta k = \gamma G \tau$, where G and $\tau$ are the spoiler amplitude and duration, respectively, and $\gamma$ is the gyromagnetic ratio. We label the states immediately before/after the RF pulse with $-/+$ superscripts, respectively. To determine a relationship between the two DESS signals, we look at the echo pathway of the observable signal immediately before the pulse, $F_0^-$, and write down the components that contributed to it. We repeat this until we reach the observable signal immediately after the pulse, $F_0^+$ (FIG. 1). As justified in Section 2.2, we will ignore signal contributions from states that have experienced two cycles of dephasing or more, as was done for the $S_2$ signal in Buxton R B. The Diffusion Sensitivity of Fast Steady-State Free Precession Imaging. Magnetic Resonance in Medicine. 1993; 29:235-243, which is incorporated by reference for all purposes. We will assume $\phi = 90°$, resulting in real valued states, without loss of generality.

$$F_0^- = \tilde{E}_{2,-1}F_{-1}^+ = \tilde{E}_{2,-1}\left(-\sin^2\frac{\alpha}{2}F_1^- + \cos^2\frac{\alpha}{2}F_{-1}^- - \sin\alpha Z_1^-\right) \quad (4a)$$

$$= -\tilde{E}_{2,1}\left(\sin^2\frac{\alpha}{2}\tilde{E}_{2,0}F_0^+ - \cos^2\frac{\alpha}{2}\tilde{E}_{2,-2}F_{-2}^+ + \sin\alpha \tilde{E}_{1,1}Z_1^+\right)$$

$$\approx -\tilde{E}_{2,-1}\left(\sin^2\frac{\alpha}{2}\tilde{E}_{2,0}F_0^+ + \sin\alpha \tilde{E}_{1,1}Z_1^+\right)$$

$$Z_1^+ = \frac{1}{2}\sin\alpha F_1^- + \frac{1}{2}\sin\alpha F_{-1}^- + \cos\alpha Z_1^- \quad (4b)$$

$$= \frac{1}{2}\sin\alpha \tilde{E}_{2,0}F_0^+ + \frac{1}{2}\sin\alpha \tilde{E}_{2,-2}F_{-2}^- + \cos\alpha \tilde{E}_{1,1}Z_1^-$$

$$\approx \frac{1}{2}\sin\alpha \tilde{E}_{2,0}F_0^+ + \cos\alpha \tilde{E}_{1,1}Z_1^- \Longrightarrow Z_1^+ \approx \frac{1}{2}\frac{\sin\alpha \tilde{E}_{2,0}}{1-\cos\alpha \tilde{E}_{1,1}}F_0^+$$

Combining Eqs. (4a-b) and using some algebra and trigonometric identities yields $$\frac{F_0^-}{F_0^+} \approx -\tilde{E}_{2,-1}\tilde{E}_{2,0}\sin^2\left(\frac{\alpha}{2}\right)\frac{1+\tilde{E}_{1,1}}{1-\cos\alpha \tilde{E}_{1,1}} \quad (5)$$

Using the stated expressions for the decay factors as well as the fact that the observed signal magnitudes are $$S_1 = F_0 e^{-\frac{TE}{T2^*}} \text{ and } S_2 = -\tilde{E}_{2,-1}F_{-1}e^{\frac{TE}{T2}}e^{-\frac{TE}{T2^*}}$$

(where we have used that the two signals are out of phase and the second signal experiences $T_2'$ rephasing), we arrive at the following expression:

$$\frac{S_2}{S_1} = e^{-\frac{2(TR-TE)}{T2}-(TR-\frac{\tau}{3})\Delta k^2 D}\sin^2\left(\frac{\alpha}{2}\right)\left(\frac{1+e^{-\frac{TR}{T1}-TR\Delta k^2 D}}{1-\cos\alpha e^{-\frac{TR}{T1}-TR\Delta k^2 D}}\right) \quad (6)$$

In each panel of FIGS. 1a-c, we consider the magnetization at the time of the right blue dot and examine the components from the time of the left blue dot that contributed to it. Graphical representations are shown of transverse and longitudinal states (above and below the dotted line, respectively). The accrued phase of the transverse magnetization is represented by the distance of the black line from the time axis. (a) The state that contributes to the measurable signal (S2) before the RF pulse is the "negatively dephased" signal following the previous RF pulse. (b) Two relevant paths before the RF pulse contribute to the state in panel 1a, shown with black arrows. These are transverse and longitudinal states that have a net dephasing from one gradient. They also contribute to the longitudinal state following the RF pulse (gray arrows). (c) The measurable signal following the previous RF pulse (S1), before dephasing by the gradient, contributes to the "positively dephased" transverse pathway from FIG. 1b. This is the desired endpoint so the pathway is not retraced further backward. The longitudinal pathway is not dephased by the gradient. The contribution of a third transverse pathway has been ignored since it comes from a doubly dephased signal, which can be neglected (shown with red x's). This gives a recursive relationship between S1 and S2 that can be easily solved, resulting in Eq. (6).

This relationship, which assumes the echoes are acquired symmetrically during the TR (with the same duration from the RF pulse to $S_1$ as from $S_2$ to the subsequent RF pulse), provides a simple analytic estimate of $T_2$ given an estimate of $T_1$ and either minimal diffusion sensitivity or an estimate of diffusivity.

In the case of low spoiling ($\Delta k \approx 0$), the model reduces to the following relationship:

$$\frac{S_2}{S_1} = e^{-\frac{2(TR-TE)}{T2}}\sin^2\left(\frac{\alpha}{2}\right)\left(\frac{1+e^{-\frac{TR}{T1}}}{1-\cos\alpha e^{-\frac{TR}{T1}}}\right) \quad (7)$$

For $\alpha=90°$, this further reduces to $$\frac{S_2}{S_1} = e^{-\frac{2(TR-TE)}{T2}}\frac{1+e^{-\frac{TR}{T1}}}{2} \quad (8)$$

In the case of very long $T_1$, Eq. (7) becomes independent of flip angle and results in Eq. (1). This equation was presented by Bruder et al. and has been used by Welsch et al, for $T_2$ estimation in cartilage. However, this relationship results in errors unless the flip angle is close to 90° or $TR/T_1$ is very small. The relationship also assumes weak spoiling so that diffusion effects may be ignored. Eq. (6) better approximates the signal over a large range of $T_1$, flip angle $\alpha$, and (zeroth) spoiler gradient moments. This is demonstrated in FIG. 2a, which shows the approximated signal from Eqs. (1) and (6), as well as highly accurate numerical computation of the signal using EPG matrices. The signal ratio is modeled with a typical $T_1$ value of 1.2 s for cartilage, assuming both weak and strong spoiling (with spoiler moments of 0.001 and 156.6 mT/m·ms, respectively), as well as a long $T_1$ value of 5 s for the weakly spoiled case, and a TR of 22.5 ms. Other parameters were TE=6.5 ms, $T_2$=40 ms, gradient duration $\tau$=3.4 ms, and ADC=1.6·10$^{-3}$ mm/s. In order for Eq. (1) to be valid with smaller flip angles (about 20°-60°), $T_1$ clearly needs to be much larger than TR.

Figure 2:
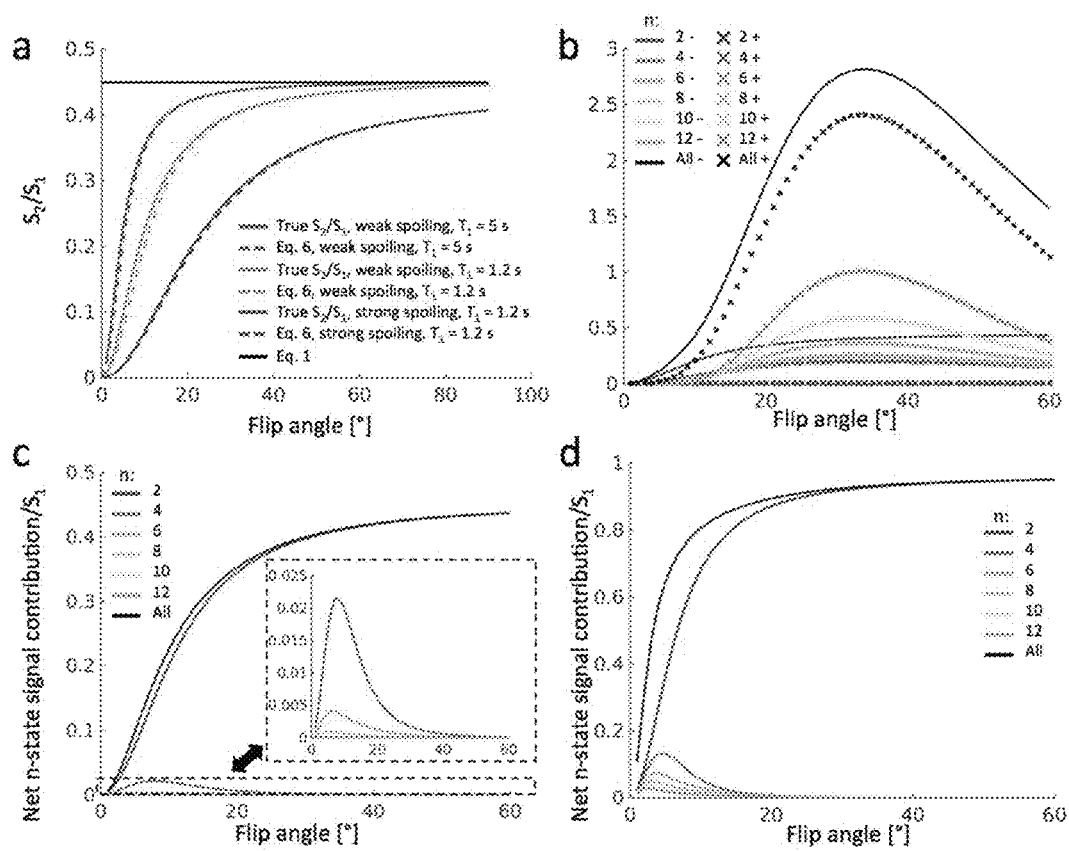
FIG. 2 is a series of graphs of signals of an embodiment.

FIG. 2a shows comparison of proposed model of Eq. (6) (dashed) with complete simulations (colored solids) and with the simple exponential model of Eq. (1) (black solid) in a tissue with $T_2$=40 ms. The blue (bottom) curves correspond to strong spoiling (gradient moment 156.6 mT/m·ms) and the green (middle) curves to weak spoiling (gradient moment 0.001 mT/m·ms), both with $T_1$=1.2 s. The red (top) curves correspond to weak spoiling and $T_1$=5 s. The green curves represent DESS scans that can be used for $T_2$ estimation in cartilage.

2.2 Cancellation of Higher-Order Echo Pathways

The model in Eq. (6) performs well for two reasons. The equation neglects the contribution of echo pathways between $S_1$ and $S_2$ that have spent more than two TRs in the transverse plane. This is partly justified by simple signal decay—the more time that the magnetization spends in the transverse plane, the more it will be attenuated both by $T_2$ relaxation and diffusion. However, a more important mechanism is the cancellation of echo pathways due to opposing phase, independent of relaxation. It is easy to show that all contributions to $S_2$ that have experienced two transverse TRs will have negative phase relative to $S_1$. However, this does not hold for higher order echo pathways. For example, if we denote TRs where the magnetization starts in the $+/-n^{th}$ transverse state or the $n^{th}$ longitudinal state by $F_{-/-n}$ and $Z_n$, then the pathways $F_0F_1F_{-2}F_{-1}$ and $F_0Z_1F_1F_{-2}F_{-1}$ will have opposite sign. By accumulating the contributions of all such pathways, the positive and negative contributions (relative to $S_1$) of higher-order pathways can be modeled and compared. For example, by including pathways with two and four transverse TRs, Eq. (6) can be extended to $$\frac{S_2}{S_1} = B_{2-} - B_{4+} + B_{4-} \quad (9)$$

where $B_{2-}$ is the two-TR component given by Eq. (6), and $B_{4+}$ and $B_{4-}$ are the four-TR components with the same and opposite phase to $S_1$, respectively, given by $$B_{4+} = 2CDEF \qquad (10)$$

$$B_{4-} = C(D^2 + E^2)F \qquad (11)$$

where $$C = e^{-\frac{4TR-2TE}{T2}-(6TR-\frac{2\tau}{3})\Delta k^2 D} \qquad (12)$$

$$D = \cos^2\left(\frac{\alpha}{2}\right) \qquad (13)$$

$$E = \frac{\frac{1}{2}\sin^2\alpha\, e^{-\frac{TR}{T1}-TR\Delta k^2 D}}{1-\cos\alpha\, e^{-\frac{TR}{T1}-TR\Delta k^2 D}} \qquad (14)$$

$$F = \sin^2\left(\frac{\alpha}{2}\right) + \frac{\frac{1}{2}\sin^2\alpha\, e^{-\frac{TR}{T1}-4TR\Delta k^2 D}}{1-\cos\alpha\, e^{-\frac{TR}{T1}-4TR\Delta k^2 D}} \qquad (15)$$

FIG. 2b displays the components $B_{n+}$ and $B_{n-}$ for n=2-12 over a range of flip angles with the same parameters as the green curve in FIG. 2a. FIG. 2b shows positive (dashed) and negative (solid) contributions to $S_2/S_1$ from pathways spending 2-12 TRs in the transverse plane. The black curves represent the sum of the different pathways. For pathways of order 6 and above, the positive (x) curves overlap with the negative (solid) curves. The higher-order components with positive and negative phase have very similar magnitude. Therefore, they will have a negligible effect on the final answer, particularly for flip angles above 20° or short $T_2$. This is demonstrated in FIG. 2c. This leads to Eq. (6) simulating the signal ratio $S_2/S_1$ very accurately, even in cases where there is very little $T_2$ decay, such as in fluid. FIG. 2c shows net contributions from the pathways in FIG. 2b shows that pathways with more than 2 TRs in the transverse plane contribute minimally. FIG. 2d shows the same simulation as FIG. 2c, but for synovial fluid at 3T, having $T_1$=3.6 s and $T_2$=0.77 s, showing that the proposed model (blue signal) approximates the true signal (black curve) well for flip angles above 20°, even for long $T_1$ and $T_2$. The higher-order pathways contribute more to the signal ratio in this case, especially for low flip angles, but Eq. (6) nonetheless approximates the true signal well for flip angles above 20°.

3. Methods

In an embodiment, all scans were performed on a 3T 750 scanner (GE Healthcare, Waukesha, Wis., USA). Informed consent was obtained from all subjects in accordance with the Institutional Review Board protocol at our institution. The volunteer scans used a 16-channel receive coil wrapped around the knee (GEM Flex by NeoCoil, Waukesha, Wis., USA), the phantom scans used a single-channel transmit-receive wrist coil (GE BC-10 by Mayo Clinic, Rochester Minn., USA), and the patient scans used an 8-channel transmit-receive knee coil (Knee Array Coil by Invivo, Gainesville, Fla., USA).

3.1 Phantom Scans

Three agar phantoms were scanned using DESS with scan parameters TR=13.4 ms, TE=3.9 ms, voxel size 0.47×0.47× 3.0 mm³, spoiler moment 7.83 mT/m·ms and duration τ=3.4 ms, and flip angles α=10°, 15°, 20°, 30°, 40°, and 50°. Fast spin-echo (FSE) scans with echo times TE=17, 26, 34, 43, 51, 60, and 68 ms, TR=1000 ms and voxel size 0.47×0.47× 6.0 mm³ were performed and fitted to a monoexponential curve to obtain a reference $T_2$. The $T_2$ value was estimated from the DESS scans using Eqs. (1) and (7) and compared to the value resulting from the reference FSE scans. For Eq. (7), reference $T_1$ values known to be $T_{1-1}$=2000 ms, $T_{1-2}$=1700 ms, and $T_{1-3}$=1600 ms, measured with a 3TI MP-RAGE technique, and a flip angle measured with the Bloch-Siegert method, were used for processing each phantom.

3.2 Volunteer Scans

To test Eq. (7) in vivo, a sagittal DESS scan was performed in the knee of three healthy volunteers. The scans used a spoiler with a moment of 15.66 mT/m·ms and duration 3.4 ms. Other parameters were α=25°, TR=22.5 ms, TE=6.5 ms, slice thickness 3.0 mm. A spectrally selective RF pulse was used. The $T_2$ of the cartilage was again estimated using the linear approximations of Eqs. (1) and (7). Reference FSE scans were acquired with TE=9, 18, 27, 36, 45, 54, 63, and 72 ms and TR=1000 ms. Both scans were run with FOV=13 cm×13 cm and acquisition matrix 384× 384, which was automatically interpolated to 512×512 by the scanner. For $T_2$ quantification using Eq. (7), $T_1$=1.2 s, typical for cartilage at 3T, and the prescribed flip angle of α=25° were used. Eq. (7) has low sensitivity to $T_1$, so small errors in the $T_1$ assumption should not cause large errors in estimated $T_2$. Furthermore, $T_1$ in knee cartilage does not change much whereas $T_2$ is sensitive to degeneration. For comparison, a $T_2$ map using a full numerical fit was produced from the DESS scan as well. This involved computing a dictionary of signal ratios for $T_2$ ranging between 10-100 ms (with a step size of 1 ms) using large EPG matrices (with 6 states) and then choosing the dictionary entry that best fitted each pixel. The total scan time was 6:26 min for FSE (acquiring 6 slices) and 5:11 min for DESS (acquiring 36 slices). In slices where both scans displayed clear anterior and posterior regions of the femoral cartilage, the resulting $T_2$ maps in those two regions were divided into deep and superficial regions, resulting in 4 regions per slice. This was possible in 10 slices, resulting in a total of 40 regions. The root-mean-squared (RMS) difference between the results from Eq. (7) and the FSE results was computed and compared to the difference between the results from Eq. (1) and the reference scans. The $T_2$ maps were computed in Matlab (The MathWorks, Natick, Mass.) on a Linux terminal with 128 GB of RAM and 32 2.6 GHz CPUs.

3.3 Patient Scans

As an initial demonstration of the value of Eq. (7) for routine diagnostic imaging, we selected data from three patients from a larger group scanned with DESS in a clinical setting (spoiler moment=31.32 mT/m·ms, spoiler duration=3.4 ms, α=20°, TR=20.4 ms, TE=6.4 ms, FOV=16 cm×16 cm, acquisition matrix 416×512, 80 slices with thickness of 1.6 mm interpolated to 0.8 mm (160 slices), 2× parallel imaging in the phase encode direction, scan time=5: 00). $T_2$ maps were constructed automatically at the scanner. A proton-density (PD) weighted scan was acquired for comparison.

4. Results 4.1 Phantom Scans

Figure 3:
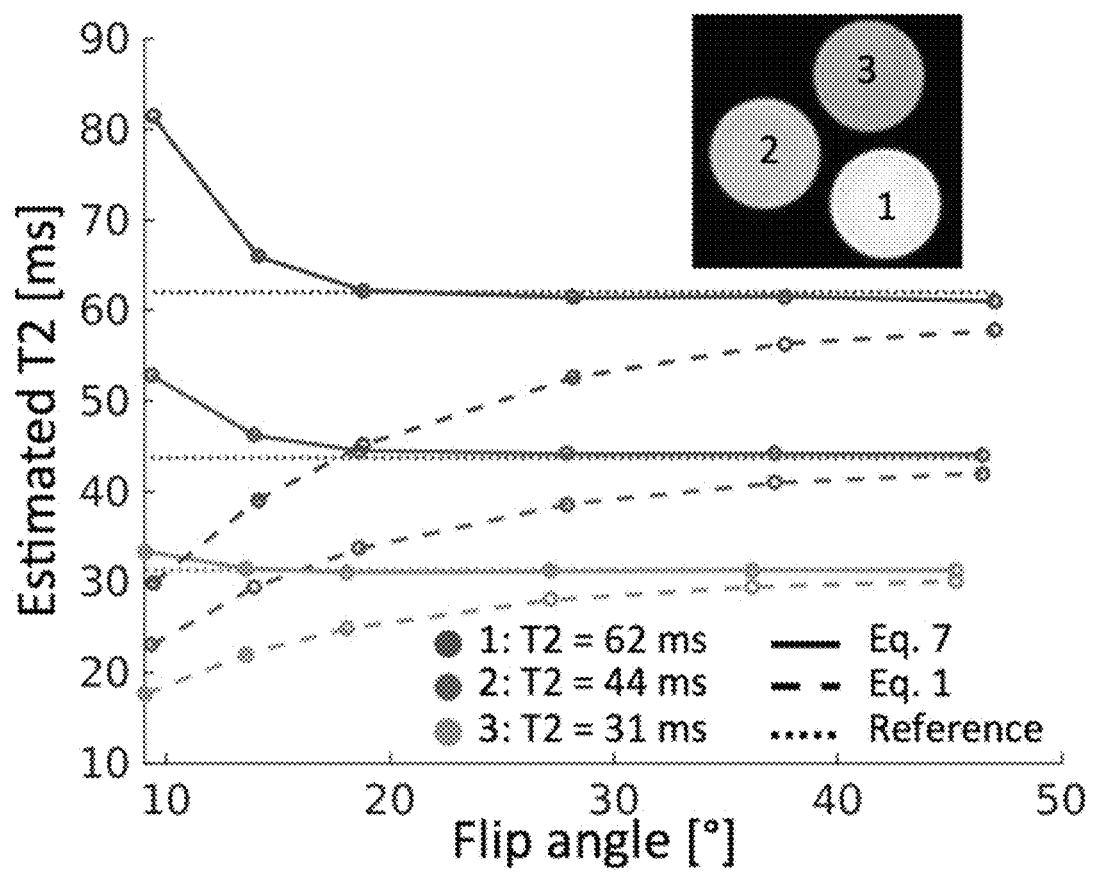
FIG. 3 illustrates results from a phantom scan.

The results from the phantom scans are shown in FIG. 3. The measured reference $T_2$ values were $T_{2-1}$=62 ms, $T_{2-2}$=44 ms, and $T_{2-3}$=31 ms for the three phantoms. Eq. (1) underestimates $T_2$ compared to the reference FSE estimate, and this becomes more pronounced for smaller flip angles. The results are shown from estimating $T_2$ from DESS using Eq. (1) (dashed) and Eq. (7) (solid) as well as from reference FSE scans (dotted). For all phantoms, Eq. (7) clearly agrees better with the reference value than Eq. (1), and for flip angles of 20° or higher, Eq. (7) agrees very well with the reference scans, but gives a substantial overestimate in the case of a large $T_2$ and 10° or 15° flip angles. However, the error is much smaller than the error from Eq. (1).

4.2 Volunteer Scans

Figure 4:
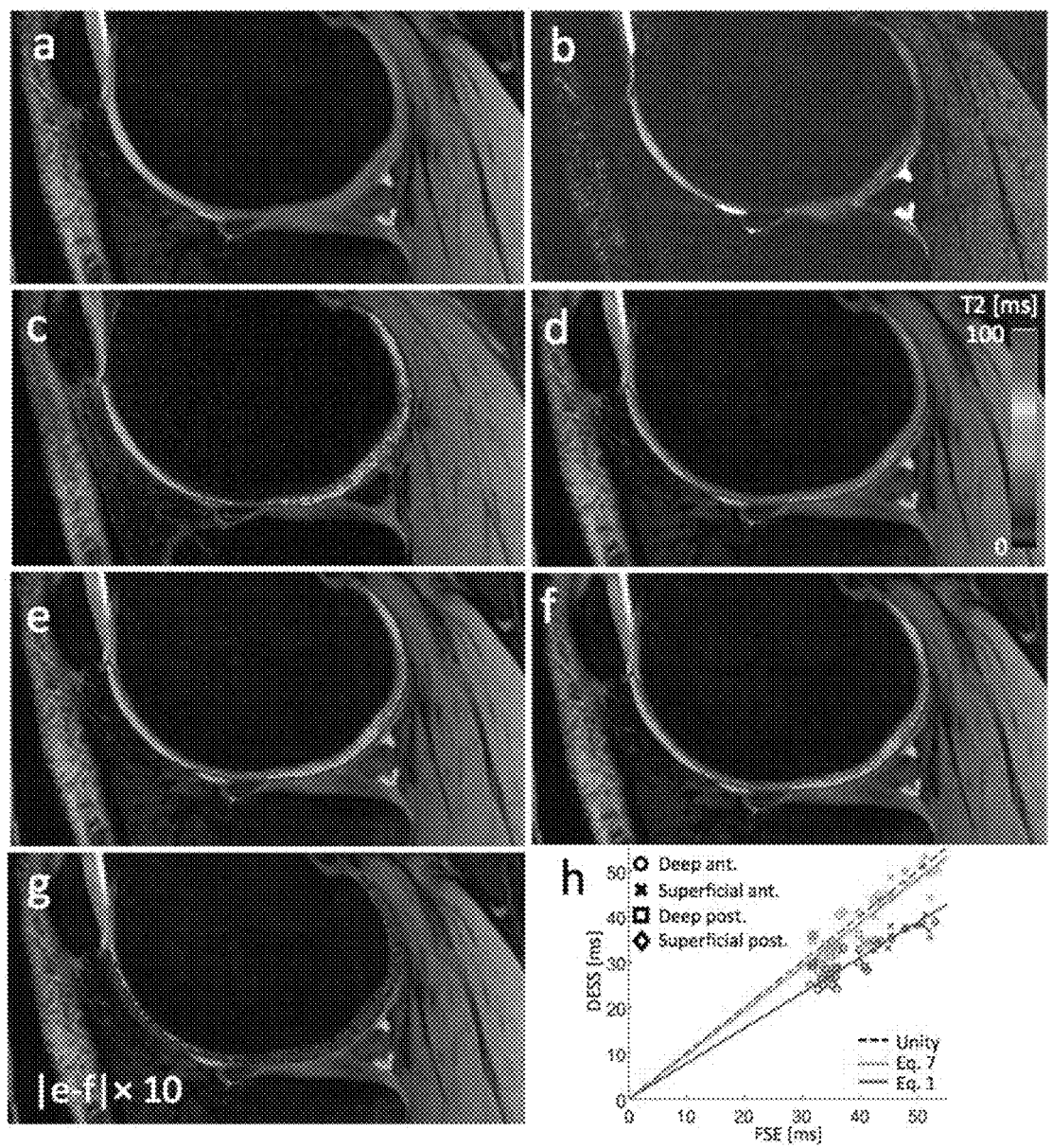
FIG. 4 is a series of images that show $T_2$ estimates from a DESS scan.

FIGS. 4a-h show the $T_2$ estimates from the DESS scan, using Eqs. (1) and (7), as well as the results from the reference FSE scans and a full numerical fit. The maps from Eq. (7) are more visually similar to the reference scans than those of Eq. (1) (FIGS. 4a-c). The RMS difference between the estimates of Eq. (7) and FSE was 3.7 ms, while for Eq. (1) it was 9.6 ms. Plotting the data points from Eq. (7) against the FSE data points and drawing a best fit line that crossed the origin yielded a slope of 0.96, while for Eq. (1) it was 0.77 (FIG. 4f). This demonstrates that Eq. (7) gave $T_2$ estimates that better agreed with FSE estimates than Eq. (1). The full numerical fit gives very similar results to those obtained by Eq. (7), as shown both by its $T_2$ map and by a difference map (scaled by 10), while taking around 60× longer to produce, with an average processing time of 577 s per DESS data set (36×512×512 data points) compared to 9 s for Eq. (7).

FIG. 4a shows the first echo ($S_1$) from a sample sagittal DESS scan. FIG. 4b shows the second echo ($S_2$) from the same DESS scan. The windowing level is not the same as in FIG. 4a, in order to show the cartilage. FIG. 4c shows a sample $T_2$ map from FSE scans of the subject in FIGS. 4a-b. FIG. 4d shows a $T_2$ map of articular cartilage from the DESS scan in panels a-b using Eq. (1). FIG. 4e shows a $T_2$ map using Eq. (7). FIG. 4f shows a $T_2$ map using a full numerical fit. The map looks very similar to the one in FIG. 4e, but took about 60× longer to produce. FIG. 4g shows a map showing the absolute difference between the maps in FIGS. 4e and f, multiplied by 10. The difference in the cartilage is small, mostly 1 ms or less. Zero difference appears as transparent. FIG. 4h shows the $T_2$ estimates from 4 regions of femoral cartilage in a total of 10 slices from 3 subjects. The trend line for Eq. (7) (green) better agrees with the FSE scans.

4.3 Patient Scans

Figure 5:
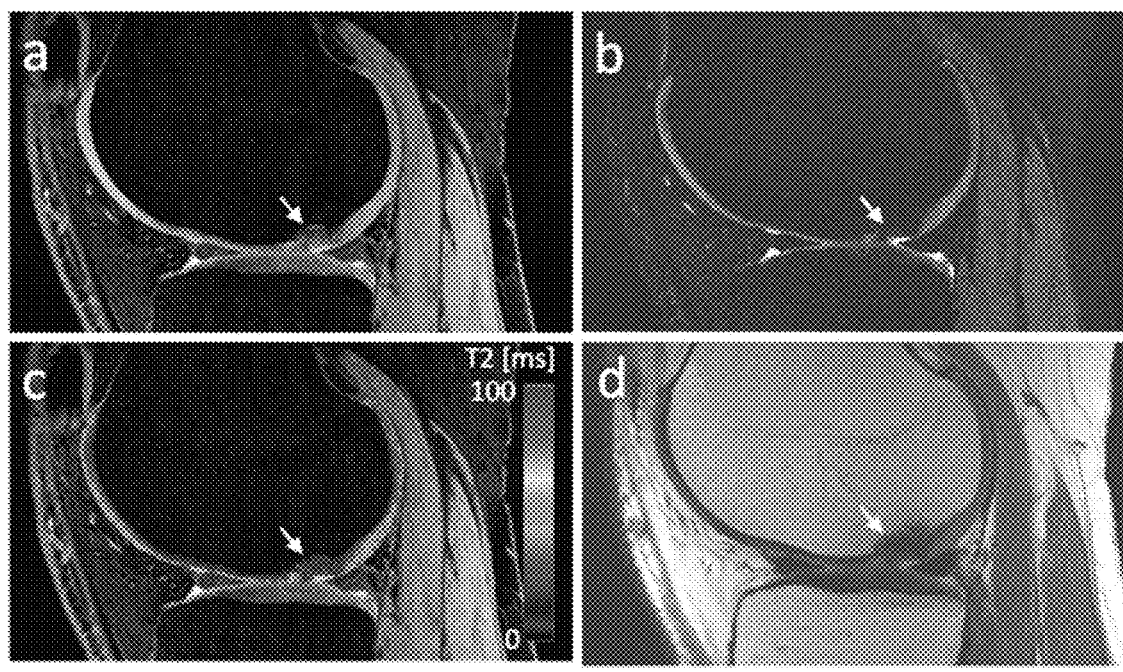
FIG. 5 is a series of images that show the scan of a patient with a history of knee injuries and osteochondral defects.

FIGS. 5a-d show the scan of a patient with a history of knee injuries and osteochondral defects, visible on the DESS images. Fibrocartilage formation is present in the damaged hyaline cartilage region and in the surrounding subchondral bone. The corresponding region in the DESS $T_2$ map shows a focal decrease in $T_2$ values. FIG. 5a shows the first echo of a DESS scan of a patient with a chondral lesion (white arrow). FIG. 5b shows the second echo of the DESS scan. FIGS. 5a-b both show cartilage signal heterogeneity in the central femoral condyle (note the different windowing settings). FIG. 5c shows the $T_2$ maps resulting from applying Eq. (7) to the data in FIGS. 5a-b. FIG. 5d shows a PD weighted scan, acquired for reference, and shows low signal in the lesion.

In another patient (not shown), the availability of the DESS $T_2$ map made it possible to visualize an oblique meniscal tear in the anterior horn of the medial meniscus, which was challenging to delineate with only the morphological images. In a third patient (not shown), a $T_2$ map acquired with DESS indicated tendinopathy where the patellar tendon had increased $T_2$ values at its insertion site, which was also relatively challenging to visualize with only the morphological DESS images.

5. Discussion

The DESS sequence allows 3D estimation of $T_2$ in cartilage with high SNR efficiency. The signal expressions are complicated, often necessitating imprecise simplifications or time-consuming numerical modeling of the signals. This study explores a linear relationship between the two DESS signals that can be used for accurately estimating $T_2$ from a single scan. Some embodiments have focused on applying the method in cartilage. Other embodiments could be used in various other anatomies. This could include $T_2$ mapping in breast cancer patients, which has been impractical due to the time consuming nature of spin-echo-based $T_2$ measurements.

The scan time for DESS used in this study was about 5 minutes. The patient scans were acquired at a higher resolution than the volunteer scans, but using parallel imaging, the scan time remained at 5 minutes at a cost in SNR. Scan time could be reduced by using lower resolution, higher readout bandwidth, fewer slices, or shorter RF pulses. However, in our experience, a 5 minute scan time is acceptable, especially considering that these 3D scans provide both morphological and quantitative information. Potentially, DESS could replace sagittal FSE scans that are widely used in many current protocols, but this needs to be studied further.

Figure 6:
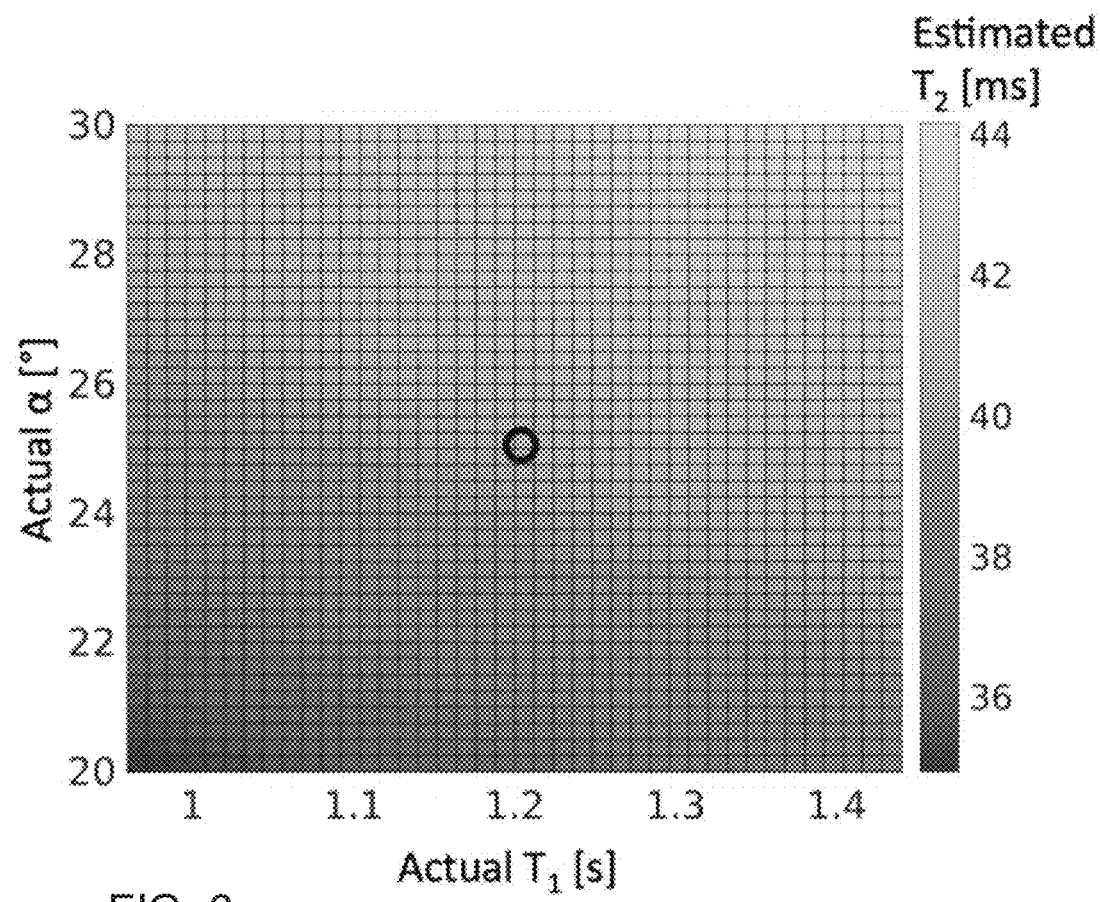
FIG. 6 shows sensitivity of the $T_2$ estimate to errors in the $T_1$ and a assumptions.

As mentioned, using the linear approximation of Eq. (7) for estimating $T_2$ from a single DESS scan requires an assumed $T_1$ value. This should not lead to large estimation errors, since the method has little sensitivity to $T_1$, which is also not expected to change much in cartilage. For example, using the same scan parameters as for the middle curve in FIG. 2a, with the same assumption of $T_1$=1.2 s, yields $T_2$ estimates of 38.8 ms and 41.8 ms (−3.0% and +4.5%) when the real $T_1$ is 0.96 s and 1.44 s (i.e., the actual $T_1$ is 20% lower or higher than the assumed value), respectively. Both values are relatively close to the actual value of 40.0 ms. A correct assumption of $T_1$=1.2 s yields $T_2$=40.6 ms (+1.5%), a slight overestimate due to the approximation made. Similarly, sensitivity to $B_1$ results in estimates of 36.9 ms and 43.1 ms (−7.75% and +7.75%) when the actual flip angle α is 20° and 30° (i.e., 20% lower or higher than the assumed value of 25°). The $B_1$ sensitivity could be mitigated by acquiring a $B_1$ map along with the DESS scan. The sensitivity of the $T_2$ estimate to errors in the $T_1$ and a assumptions is further demonstrated in FIG. 6. It should also be noted that assumptions of $T_1$ and flip angle will always be needed when estimating $T_2$ from a single DESS scan, regardless of the model used. FIG. 6 shows the sensitivity of the $T_2$ estimation method in Eq. (7) to errors in the assumption of $T_1$ and $B_1$. The true $T_2$ is 40 ms. The flip angle α and $T_1$ are assumed to be 25° and 1.2 s, but actually vary from these values by +/−20%. Other scan parameters were the same as in FIG. 2a. The black circle shows the point where the assumptions of a and $T_1$ are correct.

An embodiment can also be used in combination with other methods for quantitative DESS imaging. An embodiment could estimate other parameters such as $T_1$ or flip angle. Another embodiment would drive from Eq. (6):

$$\frac{S_{2H}S_{1L}}{S_{1H}S_{2L}} = \qquad (16)$$

$$e^{-(TR-\frac{\tau}{3})\Delta k^2 D} \frac{1 + e^{-\frac{TR}{T1}}\left(e^{-TR\Delta k^2 D} - \cos\alpha\right) - e^{-\frac{2TR}{T1}}\cos\alpha \, e^{-TR\Delta k^2 D}}{1 + e^{-\frac{TR}{T1}}(1 - \cos\alpha \, e^{-TR\Delta k^2 D}) - e^{-\frac{2TR}{T1}}\cos\alpha \, e^{-TR\Delta k^2 D}}$$

This relationship is independent of $T_2$, and largely insensitive to $T_1$.

In conclusion, an embodiment provides a simplified expression for the ratio between the DESS signals, providing good $T_2$ estimation. The expression disregards higher-order echo pathways, an assumption we have shown to be valid due to both decay and cancellation of such pathways. The expression takes into account signal dependency to $T_1$ and flip angle, and we have shown that the method works well by assuming a $T_1$ typical for the tissue and using the prescribed flip angle in calculations.

6. Algorithm

Figure 7:
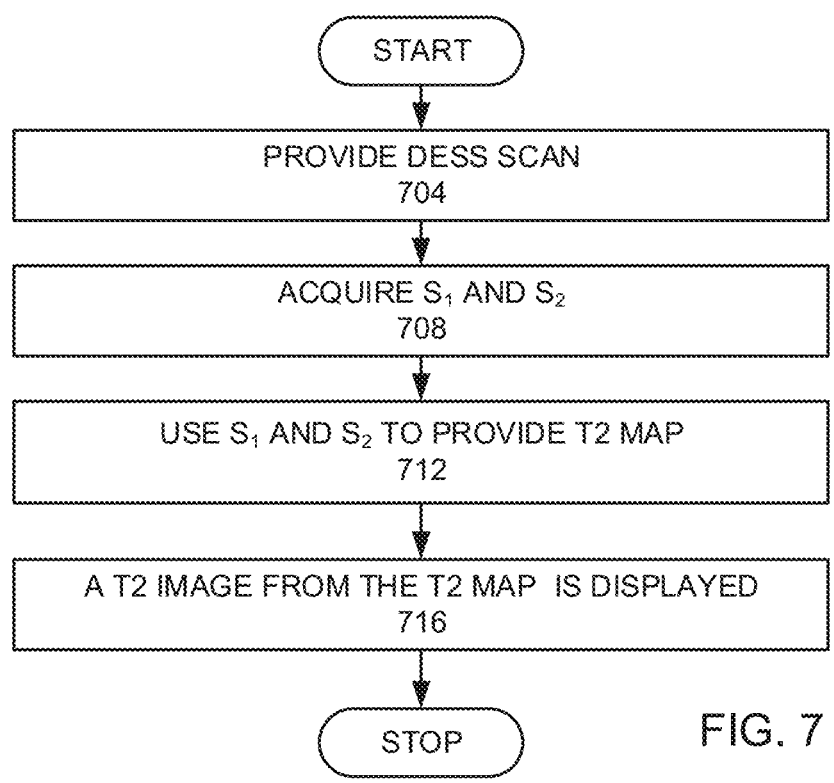
FIG. 7 is a high level flow chart of an embodiment of the invention.

To facilitate understanding, FIG. 7 is a high level flow chart of an embodiment of the invention. A DESS sequence is applied to a volume of an object by a magnetic resonance imaging (MRI) system (step 704). Signals $S_1$ and $S_2$ are acquired by the MRI system from the volume (step 708). Signals $S_1$ and $S_2$ are used to provide a $T_2$ map for a plurality of slices of the volume, comprising determining repetition time (TR), echo time (TE), flip angle $\alpha$, and an estimate of the longitudinal relaxation time ($T_1$), and wherein the DESS scan has a spoiler gradient with an amplitude G and a duration $\tau$ and ignoring echo pathways having spent more than two repetition times in the transverse plane (step 712). If the diffusivity of the tissue D is known, then Eq. (6) can be used along with the spoiler gradient amplitude G and duration $\tau$. A $T_2$ map is displayed (step 716).

In one example, Eq. (7) may be used to provide the $T_2$ map from signals $S_1$ and $S_2$ with known values of TR, TE, $\alpha$, and longitudinal relaxation time ($T_1$). The use of Eq. (7) allows echo pathways that have spent more than two repetition times in the transverse plane to be ignored. In addition, the use of Eq. (7) allows the $T_2$ map to be generated, while ignoring diffusivity, and estimating $T_1$. In another example, diffusivity is measured and Eq. (6) is used to provide the T2 map from signals $S_1$ and $S_2$ with known values of TR, TE, $\alpha$, and an estimate of $T_1$.

Figure 8:
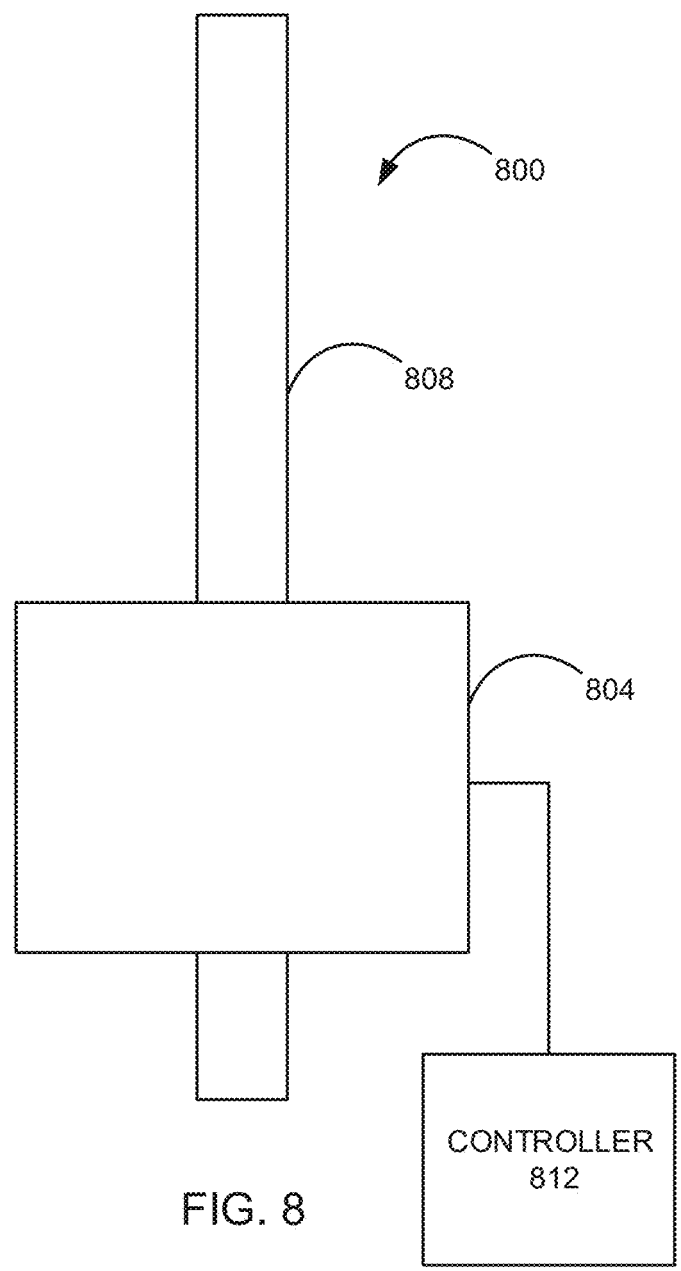
FIG. 8 is a schematic top view of a magnetic resonance imaging (MRI) system that may be used in an embodiment of the invention.

FIG. 8 is a schematic top view of a magnetic resonance imaging (MRI) system 800 that may be used in an embodiment of the invention. The MRI system 800 comprises a magnet system 804, a patient transport table 808 connected to the magnet system, and a controller 812 controllably connected to the magnet system. In one example, a patient would lie on the patient transport table 808 and the magnet system 804 would pass around the patient. The controller 812 would control magnetic fields and radio frequency (RF) signals provided by the magnet system 804 and would receive signals from detectors in the magnet system 804.

Figure 9:
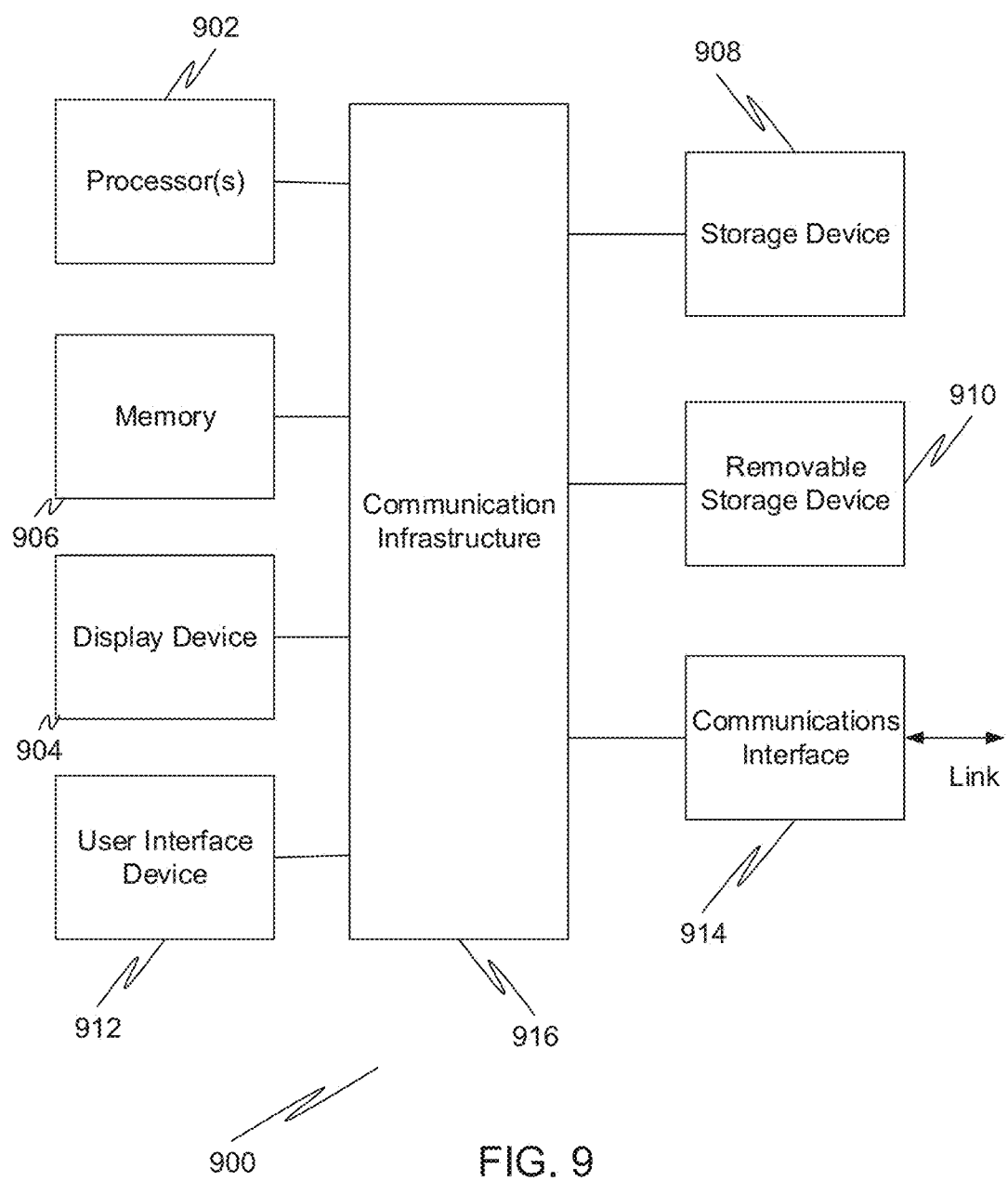
FIG. 9 illustrates a computer system that may be used in an embodiment of the invention.

FIG. 9 is a high-level block diagram showing a computer system 900, which may be used to provide the controller 812. The computer system may have many physical forms ranging from an integrated circuit, a printed circuit board, and a small handheld device up to a computer. The computer system 900 includes one or more processors 902, and further can include an electronic display device 904, a main memory 906 (e.g., random access memory (RAM)), storage device 908 (e.g., hard disk drive), removable storage device 910 (e.g., optical disk drive), user interface devices 912 (e.g., keyboards, touch screens, keypads, mice or other pointing devices, etc.), and a communication interface 914 (e.g., wireless network interface). The communication interface 914 allows software and data to be transferred between the computer system 900 and external devices via a link. The system may also include a communications infrastructure 916 (e.g., a communications bus, cross-over bar, or network) to which the aforementioned devices/modules are connected.

Information transferred via communications interface 914 may be in the form of signals such as electronic, electromagnetic, optical, or other signals capable of being received by communications interface 914, via a communication link that carries signals and may be implemented using wire or cable, fiber optics, a phone line, a cellular phone link, a radio frequency link, and/or other communication channels. With such a communications interface, it is contemplated that the one or more processors 902 might receive information from a network, or might output information to the network in the course of performing the above-described method steps. Furthermore, method embodiments of the present invention may execute solely upon the processors or may execute over a network, such as the Internet, in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In an example, a patient may be placed on patient transport table 808 of the MRI system 800. The controller 812 causes the magnet system 804 to provide a DESS sequence for a volume of the patient (step 704). In this example, the volume is a knee of the patient. Signals $S_1$ and $S_2$ are acquired by the MRI system 800 (step 708). The signals $S_1$ and $S_2$ are used to provide a $T_2$ map for a plurality of slices of the knee by determining repetition time (TR), echo time (TE), flip angle $\alpha$, longitudinal relaxation time $T_1$, and where the DESS scan has a spoiler gradient with an amplitude G and a duration $\tau$ and ignoring echo pathways having spent more than two repetition times in the transverse plane (step 712).

In this embodiment, $S_1$ and $S_2$ are used to provide a $T_2$ map using a function $$T_2 = \frac{-2(TR - TE)}{\log\left[\left(\frac{S_2}{S_1 \sin^2 \frac{\alpha}{2}}\right) f(\alpha, TR, T1)\right]},$$

where $f(\alpha, TR, T1)$ is a function that is not proportional to $$\sin^2 \frac{\alpha}{2}.$$

More preferably, in this embodiment $$f(\alpha, TR, T1) = \frac{\left(1 - (\cos \alpha) e^{\frac{-TR}{T1}}\right)}{\left(1 + e^{-\frac{TR}{T1}}\right)}.$$

It should be noted that the equation used in this embodiment, is the same as Eq. (7), when solving for $T_2$. Therefore, using Eq. (7), in the specification and claims would be the same as using the equation in this embodiment. As mentioned above, Eq. (7) may be used to provide the $T_2$ map from signals $S_1$ and $S_2$ with known values of TR, TE, $\alpha$, and an estimate of the relaxation time ($T_1$). The use of Eq. (7)

allows echo pathways that have spent more than two repetition times in the transverse plane to be ignored. In addition, the use of Eq. (7) allows the $T_2$ map to be generated, while ignoring diffusivity, and estimating $T_1$.

In this example, the controller 812 may be used to generate and then display an image on the display 904 (step 716). In this example, a plurality of $T_2$ map images are displayed, where each $T_2$ image is of a slice of the volume, so that the plurality of $T_2$ map images from a plurality of slices of the knee to provide a 3D view of the knee.

MRI systems signals measure magnetization that is perpendicular to the main magnetic field. Perpendicular signals are said to be in the transverse plane. The signals measured in steady-state sequences such as DESS are composed of magnetization components that have evolved over many repetition times (TRs). During some TRs, the magnetization is parallel to the main magnetic field, and during others, it is perpendicular to the field (in the transverse plane). In the specification and claims, ignoring echo pathways with more than two repetition times in the transverse plane means that it is assumed that the measured signal does not have magnetization components that have spent more than two repetition times in the transverse plane.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for providing an estimated 3D $T_2$ map for magnetic resonance imaging using a Double-Echo Steady-State (DESS) sequence for a volume of an object in a magnetic resonance imaging (MRI) system, comprising:

providing a DESS scan of the volume by the MRI system, wherein the DESS scan has a spoiler gradient with an amplitude G and a duration $\tau$;

acquiring signals $S_1$ and $S_2$ by the MRI system; and providing a $T_2$ map for a plurality of slices of the volume based on signals $S_1$ and $S_2$, the step of providing the $T_2$ map further comprising determining repetition time (TR), echo time (TE), flip angle $\alpha$, and an estimate of the longitudinal relaxation time ($T_1$), and ignoring echo pathways having spent more than two repetition times in the transverse plane, wherein the step of providing a $T_2$ map determines $T_2$ using a function $$T_2 = \frac{-2(TR-TE)}{\log\left[\left(\frac{S_2}{S_1 \sin^2 \frac{\alpha}{2}}\right) f(\alpha, TR, T1)\right]},$$

wherein $f(\alpha, TR, T1)$ is a function that is not proportional to $$\sin^2 \frac{\alpha}{2}$$

and TR is a repetition time, TE is an echo time, and $\alpha$ is a flip angle; and displaying the $T_2$ map.

2. The method, as recited in claim 1, wherein $$f(\alpha, TR, T1) = \frac{\left(1 - (\cos \alpha) e^{\frac{-TR}{T1}}\right)}{\left(1 + e^{-\frac{TR}{T1}}\right)}.$$

3. A method for providing an estimated 3D $T_2$ map for magnetic resonance imaging using a Double-Echo Steady-State (DESS) sequence for a volume of an object in a magnetic resonance imaging (MRI) system, comprising:

providing a DESS scan of the volume by the MRI system;

acquiring signals $S_1$ and $S_2$ by the MRI system;

providing a $T_2$ map for a plurality of slices of the volume based on signals $S_1$ and $S_2$, using the equation $$T_2 = \frac{-2(TR-TE)}{\log\left[\left(\frac{S_2}{S_1 \sin^2 \frac{\alpha}{2}}\right) f(\alpha, TR, T1)\right]},$$

wherein $f(\alpha, TR, T1)$ is a function that is not proportional to $$\sin^2 \frac{\alpha}{2}$$

and TR is a repetition time, TE is an echo time, and a is a flip angle; and displaying the $T_2$ map.

4. The method, as recited in claim 3, wherein $$f(\alpha, TR, T1) = \frac{\left(1 - (\cos \alpha) e^{\frac{-TR}{T1}}\right)}{\left(1 + e^{-\frac{TR}{T1}}\right)}.$$

* * * * *